United States Patent [19]

Bouwens et al.

[11] Patent Number: 5,085,553
[45] Date of Patent: Feb. 4, 1992

[54] DEVICE FOR THE TRANSPORT OF CARRIERS FROM AND TO A POSITIONING DEVICE AND SELECTION DEVICE FOR USE IN SUCH A DEVICE

[75] Inventors: Henricus J. J. Bouwens; Albert R. J. Bertram, both of Eindhoven, Netherlands

[73] Assignee: U.S. Philips Corporation, New York, N.Y.

[21] Appl. No.: 529,689

[22] Filed: May 23, 1990

Related U.S. Application Data

[63] Continuation of Ser. No. 158,966, Feb. 22, 1988, abandoned.

[30] Foreign Application Priority Data

Jul. 14, 1987 [NL] Netherlands .......................... 8701649

[51] Int. Cl.⁵ .............................................. B65G 35/00
[52] U.S. Cl. .................................... 414/331; 414/222; 414/416; 414/661; 414/744.5; 414/751; 901/7; 901/22
[58] Field of Search ............... 414/331, 403, 416, 417, 414/280, 660, 661, 222, 225, 226, 751–753, 744.5; 901/7, 22, 40; 198/468.6

[56] References Cited

U.S. PATENT DOCUMENTS

| | | | |
|---|---|---|---|
| 3,921,828 | 11/1975 | Suizu | 414/280 |
| 4,203,696 | 5/1980 | Lindberg | 414/280 X |
| 4,362,454 | 12/1982 | Kripzak | 414/280 |
| 4,483,654 | 11/1984 | Koch et al. | 414/744.5 |
| 4,501,527 | 2/1985 | Jacoby et al. | 414/225 |
| 4,558,983 | 12/1985 | Freeman et al. | 414/331 |
| 4,584,045 | 4/1986 | Richards | 414/744.5 X |
| 4,687,542 | 8/1987 | Davis et al. | 414/222 X |
| 4,728,252 | 3/1988 | Lada et al. | 414/744.5 |
| 4,778,331 | 10/1988 | Kimata et al. | 414/225 X |

Primary Examiner—David A. Bucci

[57] ABSTRACT

A device for the transport of carriers (11,29), in which displaceable containers (27,31) with carriers (29,11) can be coupled with a selection device (33), which is displaceable in vertical direction along a container (27,31) and has two relatively vertical positions with respect to the container (27,31) for the transport of carriers (11,29) at a bringing stage and at a fetching stage, respectively, from and to a positioning device R(B), R(C). The selection device (33) for use in the transport device as described. Use of the transport device with selection device lies particularly in the field of the flexible automation.

13 Claims, 11 Drawing Sheets

DEVICE FOR THE TRANSPORT OF CARRIERS FROM AND TO A POSITIONING DEVICE AND SELECTION DEVICE FOR USE IN SUCH A DEVICE

This is a continuation of application Ser. No. 158,966, filed Feb. 22, 1988, now abandoned.

The invention relates to a device for the transport of carriers from and to a positioning device.

The invention also relates to a selection device for use in such a device.

In a device known from the magazine "Assembly Automation" 7 (2), 59–62, 1987 of the kind mentioned in the opening paragraph, four robots (positioning devices) are arranged on one side of an assembly line, while a so-called vibration feeder for the supply of components is arranged opposite to each of these four robots on the other side of the assembly line. The components may be brought near an outlet of the vibration feeders by the robot from the opposite side of the assembly line to a carrier and may be assembled on the latter by the robots with other components. In the case in which in a working station with associated robot and supply of components another component must be mounted, in the design described it is necessary that per working station a number of vibration feeders for different components are present. This not only requires a considerable amount of space at the assembly line, but also leads to a higher sensitivity to disturbances of the assembly process and to a limited choice in the kind of components.

The invention has for its object to provide a device for the transport of carriers from and to a positioning device, in which the disadvantages described are avoided.

The device according to the invention is for this purpose characterized in that containers displaceable in a horizontal direction and comprising carriers grouped in a vertical direction can be coupled with a selection device, which is displaceable in the vertical direction along a container and is provided with a gripper mechanism, which is displaceable in horizontal direction and can be coupled with carriers displaceable in horizontal direction between the container and the selection device, at a delivery stage of the selection device a gripper mechanism being coupled at a first relatively vertical level between the selection device and the positioning device with a carrier in the selection device and being displaced together with the carrier in horizontal direction to the positioning device, while at a fetch stage of the selection device a gripper mechanism is coupled at a second relatively vertical level between the selection device and the positioning device with a carrier at the area of the positioning device and is displaced together with the carrier in the horizontal direction from the positioning device to the selection device. It should be noted that the carrier may be designed for the transport of components, of products, of tools or of combinations thereof. A product may also be a so-called half-product, which must still be subjected to a number of operations.

Due to the fact that the selection device is displaceable with the gripper mechanism arranged therein in vertical direction along the container, a very flexible supply of different components or products on standard carriers is obtained, which requires relatively little permanently occupied space at the assembly line.

It should be noted that in the book "Flexible Automation in Japan", published in 1984 by John Hartley, p. 165, a device is described for the transport of components from and to a robot, in which for the supply of components from a container use is made of an elevator in which filled component carriers are constantly moved downwards in vertical direction, while for the discharge of the empty component carriers use is made of a similar elevator, in which the component carriers are constantly moved upwards in vertical direction. The elevators operating according to the principle "first in first out" permit little variation in the kind of components which must be supplied within a given time period because this kind is then strongly fixed by the stack order of the containers.

A particular embodiment of the equipment according to the invention, to which a relatively large number of functions can be assigned, is further characterized in that the selection device comprises a first and a second gripper mechanism arranged in a frame, which is provided at a first vertical level with a first pair of parallel guides for a carrier associated with the first gripper mechanism and is provided at a second vertical level with a second pair of parallel guides for a carrier associated with the second gripper mechanism.

A further embodiment of an equipment according to the invention having a comparatively small mass of the selection device is characterized in that the selection device displaceable between a container and a positioning device in vertical direction comprises a single gripper mechanism by means of which carriers are displaceable at the bringing stage in horizontal direction to a first vertical level on a table in the positioning device and are displaceable by means of the table displaceable in vertical direction to a second vertical level in the positioning device, at which a pair of parallel guides are situated for supporting and horizontally transporting the carrier at the fetch stage.

A still further embodiment of an equipment according to the invention having a comparatively simple compact and robust gripper mechanism, which operates according to the principle of a straight line guiding and in which the movement of the gripper or end effector takes place uniformly without jolts, is characterized in that the gripper mechanism comprises two rods, which are displaceable in a horizontal plane at right angles to a vertical main axis and of which a driving rod is rotatable about the main axis, while a supporting rod pivotably connected to the driving rod is rotatable about a pivot axis parallel to the main axis, and end effector coupled rod with the supporting rod being displaceable along a straight line, which perpendicularly intersects the main axis.

A still further embodiment of an equipment according to the invention, in which the gripper mechanism has a comparatively large stroke, is characterized in that the driving arm is rotatably journalled at the area of the main axis in a slide which is displaceable parallel to the said straight line, along which the end effector is displaceable, this slide being provided with a drive for the rotation about the main axis of the driving rod.

A further embodiment of an equipment according to the invention, in which the straight line guiding of the gripper mechanism is obtained in a comparatively simple manner, is characterized in that the drive of the driving rod supported by the slide has a first gear wheel, which is secured on the slide, whose centre line coincides with the main axis and which meshes with a second gear wheel, which is rotatably arranged on the driving rod, rolls off over the first gear wheel and meshes with a third gear wheel, which is secured on the supporting rod and whose centre line coincides with said pivot axis, the pitch circle diameters of the first, second and third gear wheels having a ratio of 2:1:1, while the lengths of the driving rod and the supporting rod have a ratio of 1:1.

A still further embodiment of a device according to the invention having a clearance-free drive for the driving rod of the gripper mechanism is characterized in that the slide constitutes a guide for a carriage, which is displaceable with respect thereto parallel to the said line and is coupled by means of two flexible strips with a disk, which is secured to the driving rod and is rotatable together with the driving rod about the main axis.

A still further embodiment of a device according to the invention having a comparatively light and inexpensive drive of the carriage is characterized in that the carriage is coupled with a first pneumatic motor secured on the slide, while the carriage is displaceable against spring force with respect to the slide.

The invention will be described more fully with reference to the drawing, in which.

Figure 3:
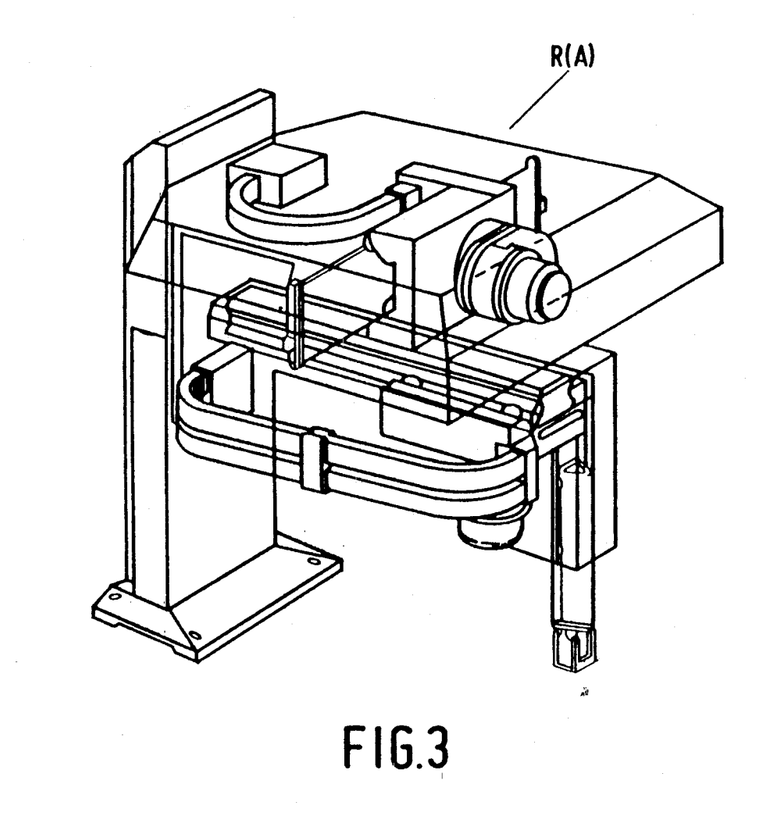
FIG. 3 shows on an enlarged scale a first kind of robot as used in the assembly lines shown in FIGS. 1 and 2.
Figure 4:
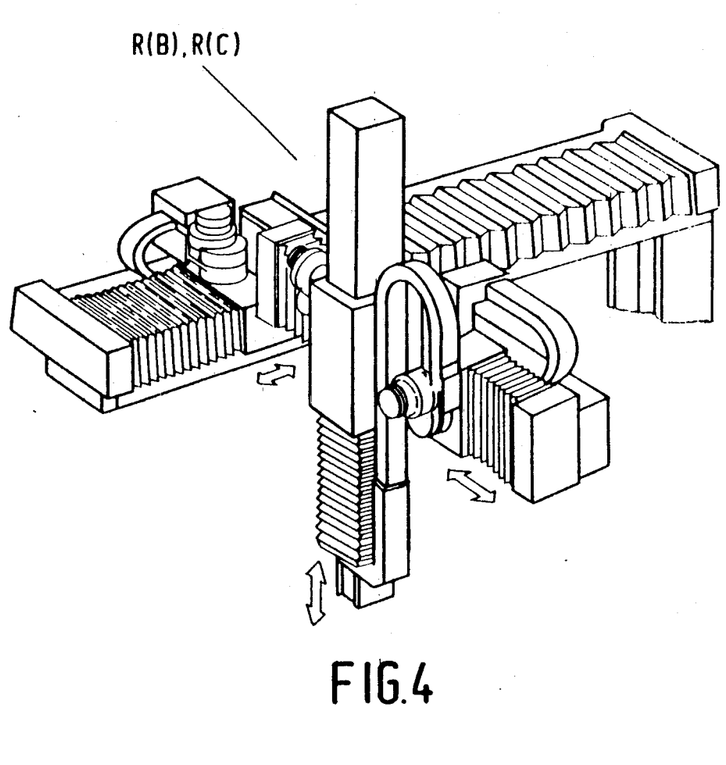
FIG. 4 shows on an enlarged scale a second kind of robot are used in the assembly lines shown in FIGS. 1 and 2.

The first kind of automized assembly line illustrated in FIG. 1 has a so-called decentral supply of components, which will be explained more fully hereinafter. The assembly line designated by reference numeral 1 is composed of two parallel tracks 3 and 5, which are coupled near a beginning point and an end point with each other by means of a first transfer member 7 and a second transfer member 9. On the tracks 3 and 5 are arranged a number of plate-shaped product carriers 11, which follow on the assembly line 1 a trajectory indicated by arrows 13. The product carriers 11 are driven in the horizontal tracks 3 and 5 by friction rollers 15, which are coupled by means of ropes 17 with parallel horizontal driving shafts 19 and 21 extending throughout the length of the tracks. In the transfer members 7 and 9 are present friction rollers 23, which are driven in the same manner as the friction rollers 15. The component supply takes place from a central store 25, in which are situated containers 27 displaceable in the horizontal direction and comprising plate-shaped component carriers 29 grouped in the vertical direction. The central store 25 further comprises containers 31, which are displaceable in the horizontal direction and are filled with the product carriers 11 grouped in the vertical direction. The containers 27 and 31 in the present case have the same construction, although this is not necessary. The plate-shaped component carriers 29 and the plate-shaped product carriers 11 have the same outer dimensions and can be arranged both in the containers 27 and in the containers 31, although this is not the case here. A product on a product carrier 11 may be, for example, a frame, in which the components of a component carrier 29 have to be mounted at the area of a so-called working station. With a decentral supply of components, these components are supplied at the area of a working station to the assembly line 1 by means of the component carriers 29, while the supply of the product carriers 11 takes place elsewhere along the assembly line 1. The supply and the discharge of filled and empty component carriers 20 takes place with the assembly line shown in FIG. 1 with working stations A, B and C decentrally at the working stations B and C. The supply and the discharge of untreated and treated product carriers 11 takes place in the station D. In the working stations A, B and C are situated assembly robots R(A), R(B) and R(C), respectively, of a kind as shown on an enlarged scale in FIGS. 3 and 4. It appears from FIGS. 3 and 4 that the robots R(A), R(B) and R(C), viewed in a horizontal plane, have a rectangular working space, which can be caused to cover optimally the required assembly area of the assembly line 1. In each of the working stations A, B and C is situated a centering device (not shown) of a conventional type, with which by means of pins and centering holes in the component carriers 29 a correct relative positioning is obtained of the robots and the component carriers. Both the centering devices (not shown) and the robots have to be considered as a positioning device of the kind as already stated in the preamble. The centered position of the component carrier 29 is a waiting position, from which the robot can transport components from a local store to a product carrier 11 situated on the track 3 of the assembly line 1.

Figure 1:
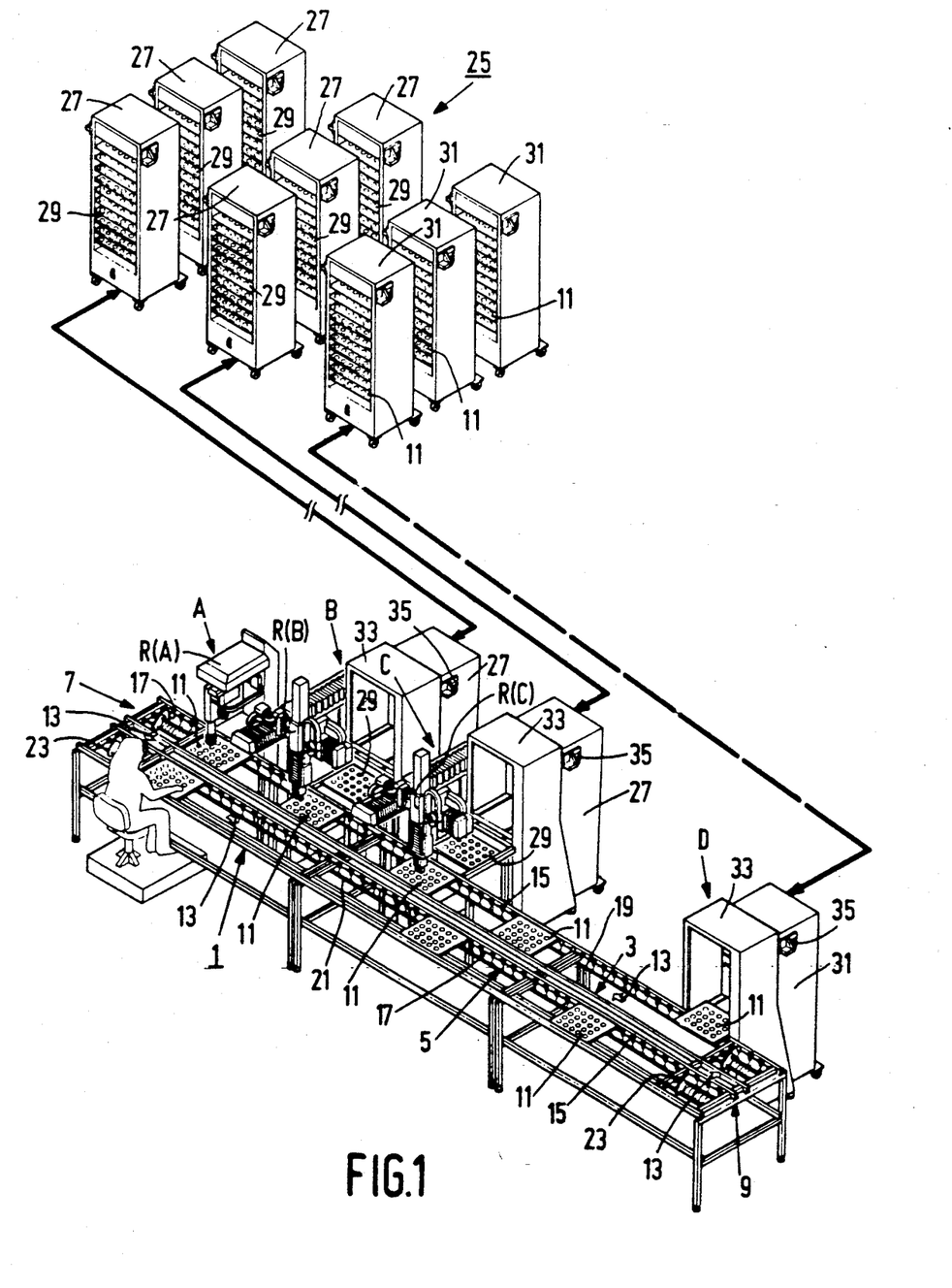
FIG. 1 shows a first kind of automatized assembly line, in which a device according to the invention is used.
Figure 12:
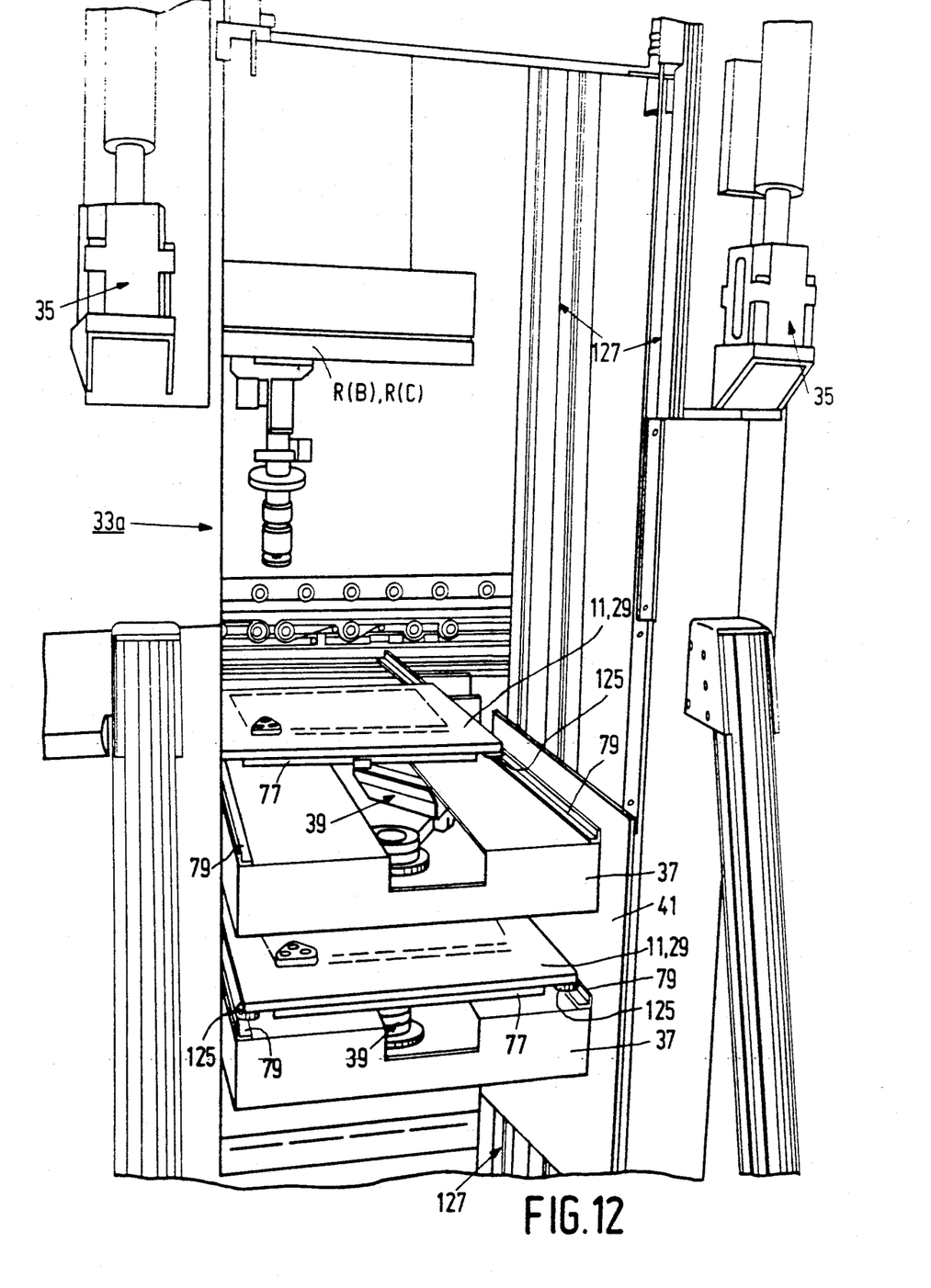
FIG. 12 is a perspective rear view of a part of an assembly line with a selection device corresponding to FIG. 11.

Between the containers 27 comprising components in the working stations B and C and the assembly line is arranged a selection device 33 (FIG. 1). In the station D is also arranged a selection device 33 between the container 31 comprising products and the assembly line 1. The containers 27 and 31 can be detachably secured to the selection devices 33 by means of a pneumato-mechanical coupling 35, of which a part situated on the containers is shown in FIG. 1 and a part situated on the selection device is shown in FIG. 12. By means of the selection device 33, product carriers 11 and component carriers 29 can be transported from a container 31 to the assembly line 1 (track 3) and from a container 27 to a centered position in one or more of the working stations A, B and C, respectively. The displacements of a component carrier or product carrier associated with such a transport will be discussed with reference to the digrammatic FIGS. 5 and 6 before the construction of the selection device 33 will be described.

Figure 2:
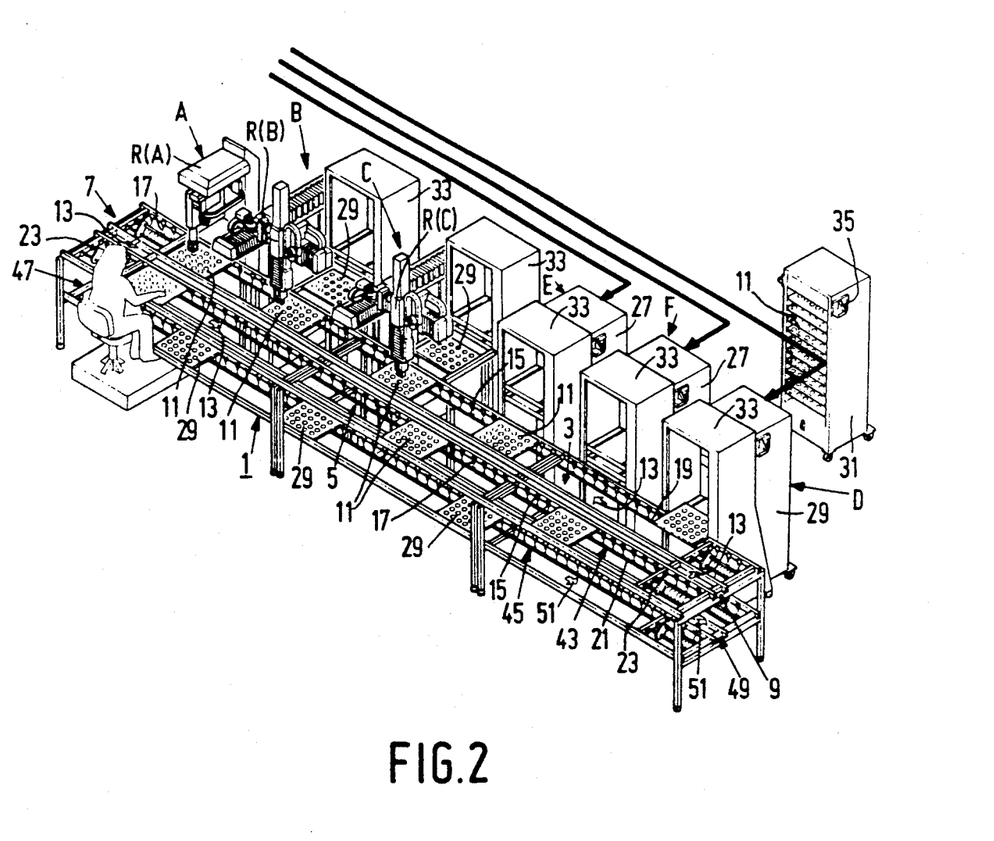
FIG. 2 shows a second kind of automatized assembly line, in which a device according to the invention is used.
Figure 5:
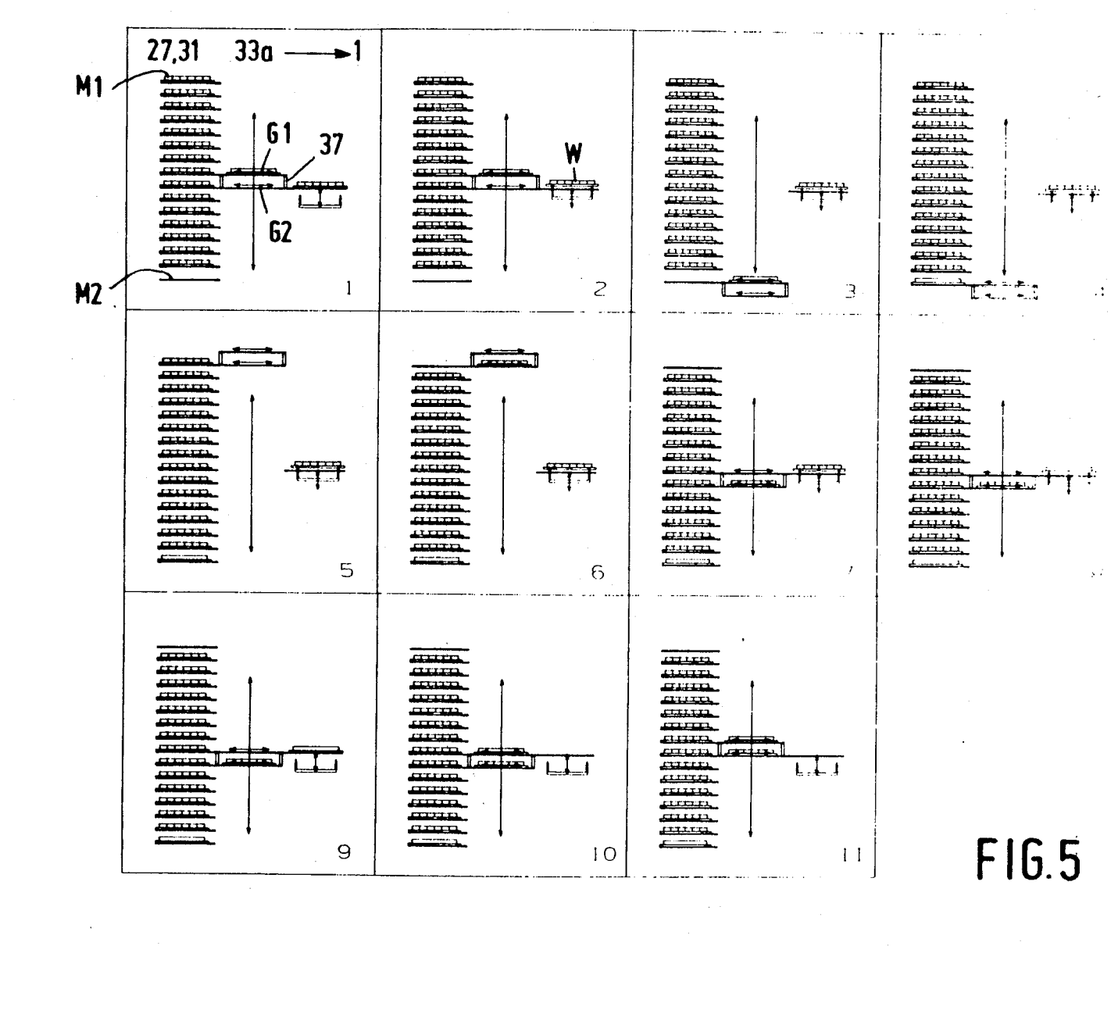
FIG. 5 shows diagrammatically the operation of a first kind of selection device that can be used in the assembly lines shown in FIGS. 1 and 2.
Figure 6:
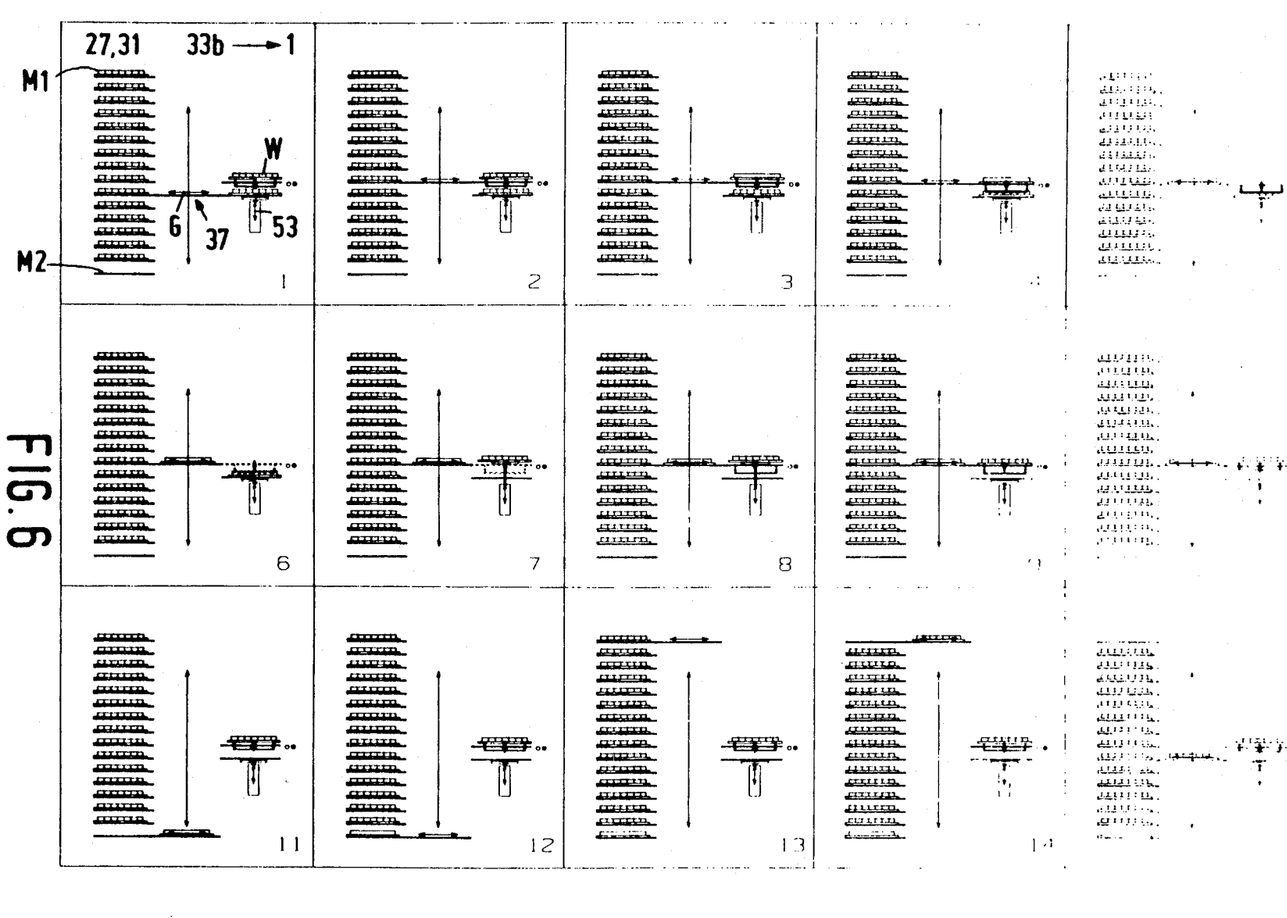
FIG. 6 shows diagrammatically the operation of a second kind of selection device that can be used in the assembly lines shown in FIGS. 1 and 2.
Figure 7:
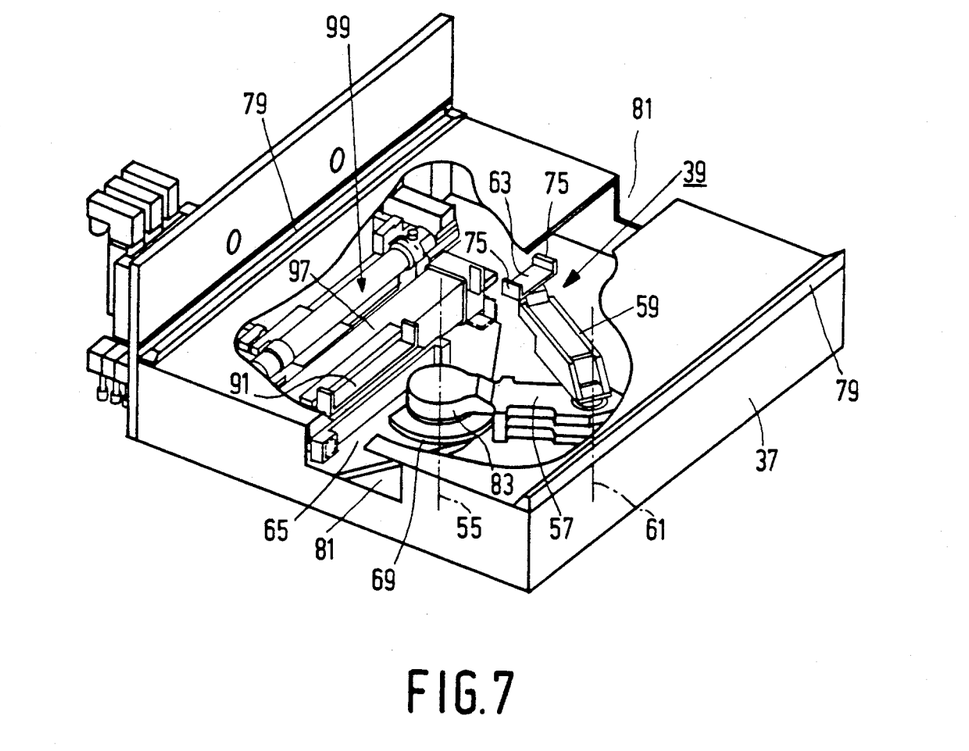
FIG. 7 is a perspective plan view of a gripper mechanism that can be used in selection devices shown in FIGS. 1, 2, 5 and 6.
Figure 11:
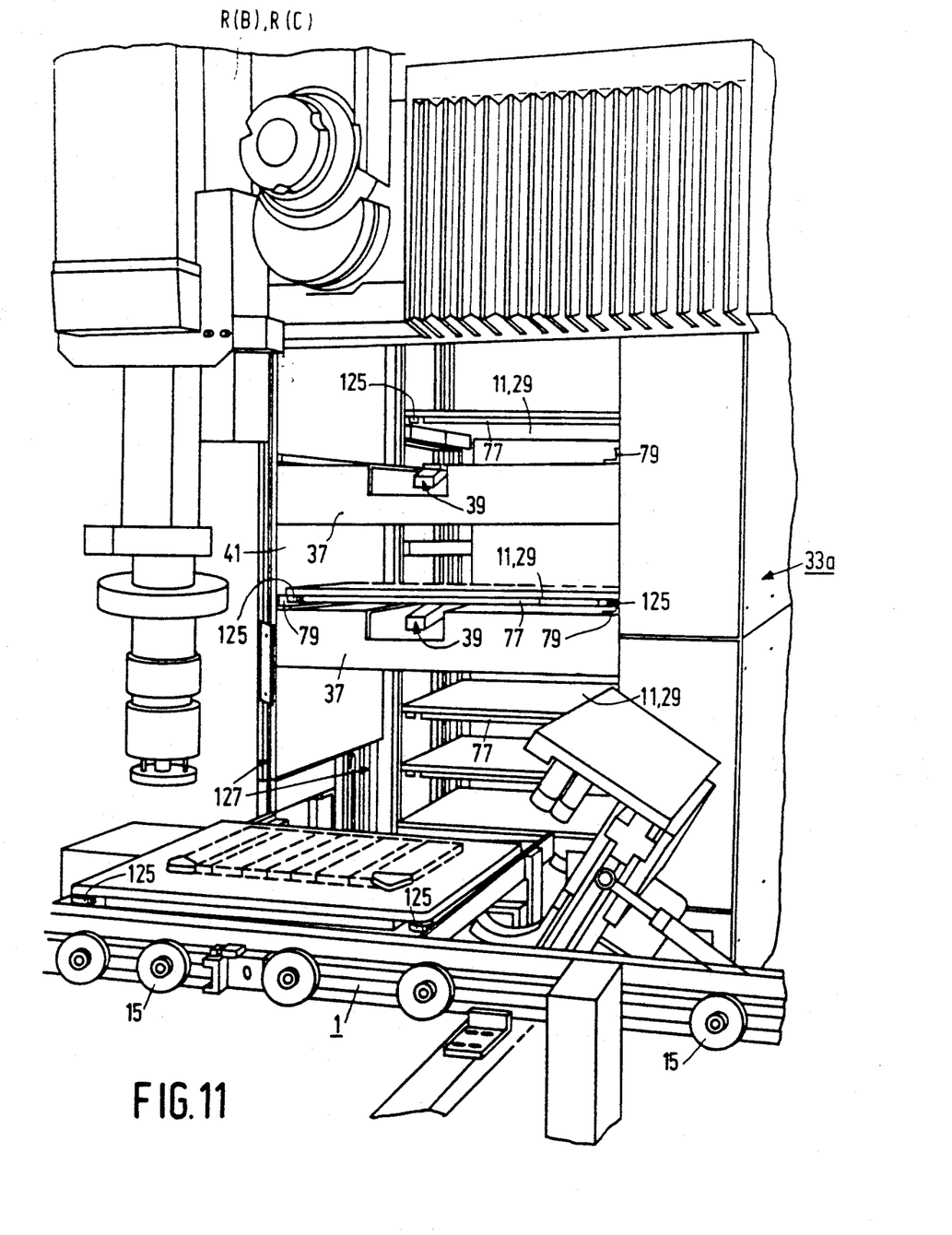
FIG. 11 shows a perspective front elevation of a part of an assembly line with a selection device.

FIG. 5 shows the displacements of a first kind of selection device 33a comprising first and second gripper mechanisms 39 (FIG. 7) arranged in a frame 37, while FIG. 6 shows the displacements of a second kind of selection device 33b comprising only a single gripper mechanism 39 arranged in a frame 37. The gripper mechanisms 39 of the two kinds of selection devices 33a and 33b have the same construction and are shown in FIGS. 7, 8 and 9. FIGS. 11 and 12 show a selection device of the first kind comprising two gripper mechanisms. The two frames 37 each with a gripper mechanism 39 are secured to a slide 41, which is displaced in vertical direction so as to be program-controlled (cf. FIG. 11). With the second kind of automatized assembly line 1 shown in FIG. 2, the same constructional modules are used as with the assembly line 1 shown in FIG. 1, while the also the same kind of robots, the same containers and the same selection devices are used. FIG. 2 serves to illustrate the flexibility of the device according to the invention and is therefore also provided as far as possible with reference numerals corresponding to FIG. 1. With the assembly line 1 shown in FIG. 2, the supply and discharge of the component carriers 29 take place at the area of two stations E and F and do not take place at the area of the working stations A, B or C. The supply and the discharge of the product carriers 11 take place in the station D. Such a supply and such a discharge of component carriers and product carriers not taking place in the working stations A, B or C are designated as central supply and discharge. The assembly line 1 is now provided with two levels namely an upper level with the tracks 3,5 and the transfer members 7,9, at which product carriers 11 follow the trajectory 13, and a lower level with the tracks 43,45 and transfer members 47,49, at which component carriers 29 follow a trajectory 51. The component carriers 29 are driven in the same manner as described already hereinbefore with reference to FIG. 1. The selection devices 33 in the working stations B and C serve in the first place as an elevator between the two levels of the assembly line. The selection devices 33 in the stations E and F always operate to two sides: on the side of the containers 27 with component carriers 29 a choice is made from the levels of the containers, while on the side of the assembly line 1 component carriers 29 are constantly supplied to or discharged from the lower level of the assembly line 1. The supply and the discharge of component carriers 29 to and from the working stations A, B or C consequently always take place by way of the tracks 43, 45 at the lower level of the assembly line. Transit of component carriers 29 in the horizontal direction through the selection devices 33 of the working stations B or C to some store is not in order, although the system would be suitable for this purpose.

When comparing the assembly line having a decentral supply of components as shown in FIG. 1 with the assembly line having a central supply of components as shown in FIG. 2, it appears that the two systems have various advantages. The assembly line having a decentral supply of components at the area of the working stations A, B or C has a comparatively low load of the transport system, a comparatively simple process control and a comparatively small capital investment. The assembly line having a central supply of components in a fixed (central) position in accordance with the assembly line not located in the working stations A, B or C exhibits a comparatively clear and unambiguous transport from the central store to the assembly line, a comparatively small spread of material over the assembly line so that supervision thereof is simple and a comparatively high flexibility (freedom of choice) in the case of modification of the assembly pattern (among other things the order of assembly operations in the working stations).

In the selection device 33a shown in FIG. 5, which comprises two grippers G1 and G2 arranged in the frames 37, a delivery stage and a fetch stage for a component or product carrier 29,11 is described more fully by means of eleven enumerated processing steps (illustrations 5.1 to 5.11). There is started with an illustration 5.1, in which the situation is shown in which the gripper G2 has just transported a full carrier (end delivery stage) to the centering device (positioning device). Subsequently, illustration 5.2 shows a centering of the carrier, as a result of which the latter reaches a working level W. In illustration 5.3 the assembly operations are started and the frame 37 descends to a level M2 in the container 27,31. The gripper G1 is now located at the level M2 and places in the illustration 5.4 an empty carrier in the container. The frame 37 then ascends to the level M1 in the container in the illustration 5.5 and the lower gripper G2 fetches in the illustration 5.6 a full carrier to the frame 37. The illustration 5.7 indicates that the frame 37 has descended to just below the working level and is in a waiting position until the carrier in the position device is empty and the assembly operations have terminated. In the illustration 5.8, the carrier is emptied by the robot, while in the illustration 5.9 the empty carrier is decentered in the positioning device. Subsequently, in the illustration 5.10 the upper gripper G1 has transported the empty carrier from the positioning device to the frame 37. In the illustration 5.11, the frame 37 has ascended to slightly below the working level W so that the lower gripper G2 can bring a full carrier to the positioning device and a new starting position is reached.

In the selection device 33b shown in FIG. 6, which comprises only one gripper G arranged in the frame 37, a delivery stage and a fetch stage for a component or product carrier 29,11 are described by means of fifteen enumerated processing steps (illustrations 6.1 to 6.15). There is a started with the illustration 6.1, in which the situation is shown in which a gripper G has just transported a full carrier from the selection device 33b to a table 53 pneumatically displaceable in the vertical direction. Thus, the table 53 can be provided with a full carrier below the working level W at which a decentered carrier is arranged, which is subjected to the operation of a robot at the assembly line 1. In the illustration 6.2, the selection device 33b ascends to just below the working level W and is at that level in a waiting position until the upper carrier is emptied by the robot at the level W. This situation is reached in the illustration 6.3. In the illustration 6.4, the upper carrier is decentered. After the upper empty carrier has been gripped by the gripper G, the gripper G transports the empty carrier to the selection device 33b, as indicated in the illustration 6.5. It should be noted that two parallel straight line guidings for a carrier, which can be moved in the horizontal direction away from each other and towards each other, are located just below the working level W. Such a parallel displacement of guidings may be obtained, for example, by means of a rod mechanism or eccentric mechanism, which is driven by a pneumatically controlled piston. In the illustration 6.6, the way has already been cleared for the table 53 by lateral displacement of the said carrier guidings. In the picture 6.7, the ascending table 53 has brought the full table to the working level W. The illustration 6.8 represents the return of the carrier guidings to the position in which they support the full carrier at the level W. In the illustration 6.9, the table 53 has descended, while in the illustration 6.10 the carrier has been centered at the level W with respect to the robot (positioning device). The illustration 6.11 represents the start of the processing stage and the descent of the selection device 33b so that the gripper G can place the empty carrier at the level M2 in the container 27,31. In the illustration 6.12, the empty carrier is already situated in the container and the gripper has been displaced to the right so that the selection device 33b can ascend to the level M1 in the container 27,31 to fetch a full carrier. This is indicated in the illustration 6.13. In the illustrated 6.14, the full carrier has already been transported to the selection device 33b so that it can descend to the position below the working level W indicated in the illustration 6.14. The full carrier is then brought by the gripper G to the table 53. This also takes place when the carrier situated at the level W is still being processed. A new starting position is now reached in fact.

A comparison of the selection devices 33a and 33b shown in FIGS. 5 and 6 clearly shows that one of the aforementioned two relative vertical levels represents a local supply level with an associated waiting position located for the selection device 33a in the selection device itself and for the selection device 33b below the working level W at the area of the positioning device (centering device, robot). The delivery stage of the selection device 33a shown in FIG. 5 relates to the illustrations 5.11 and 5.1, while the fetch stage relates to the illustrations 5.9 and 5.10. In the case of the selection device 33b shown in FIG. 6, the delivery stage relates to illustrations 6.15 and 6.1, while the fetch stage relates to the illustrations 6.4 and 6.5. It should be noted that the terms "fetch stage" and "delivery stage" only relates to the interactions between the selection device and the positioning device and do not relate to the steps of bringing empty carriers to the container and of fetching full carriers from the container. The relative vertical transport levels between the selection device and the positioning device and not the relative position of the selection device and the container are characteristic of the invention.

Figure 8:
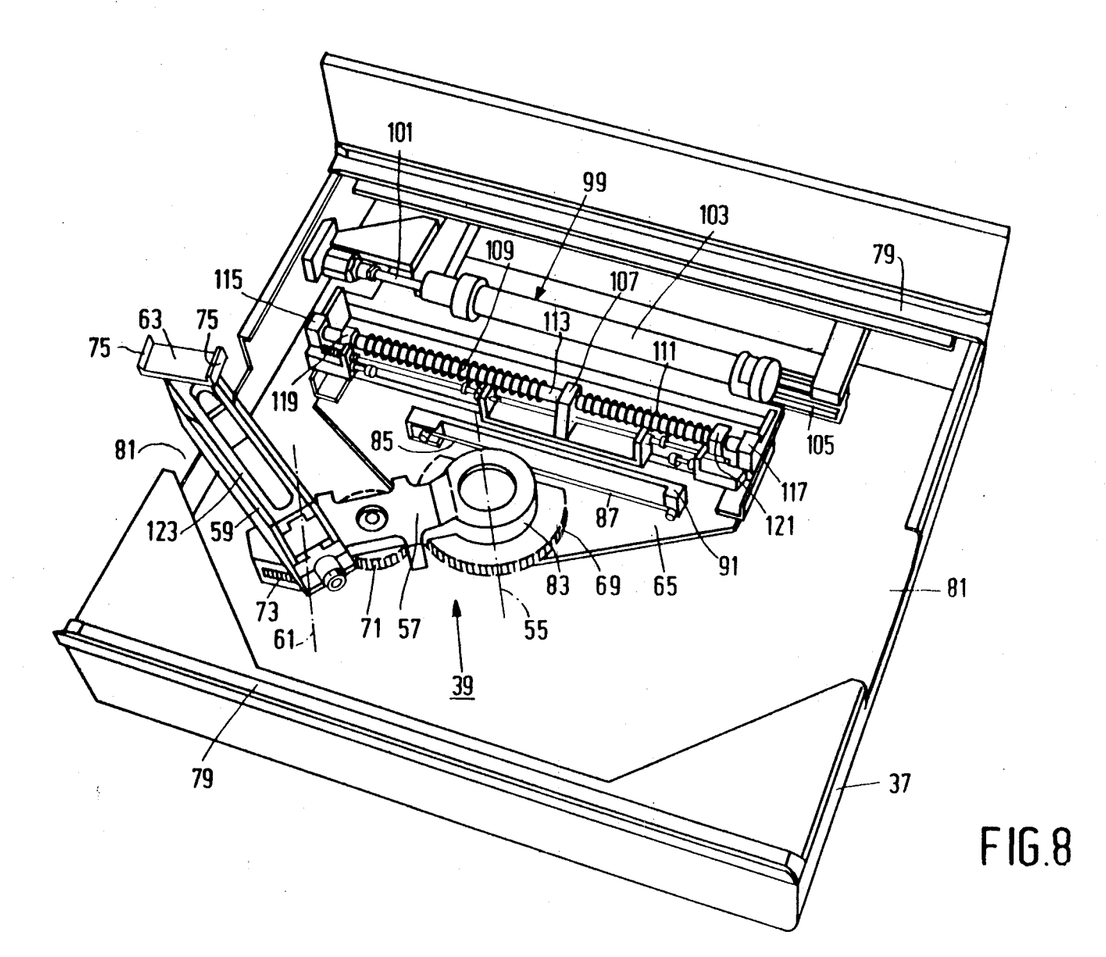
FIG. 8 is a further perspective plan view of the gripper mechanism shown in FIG. 7 in a different position.
Figure 9:
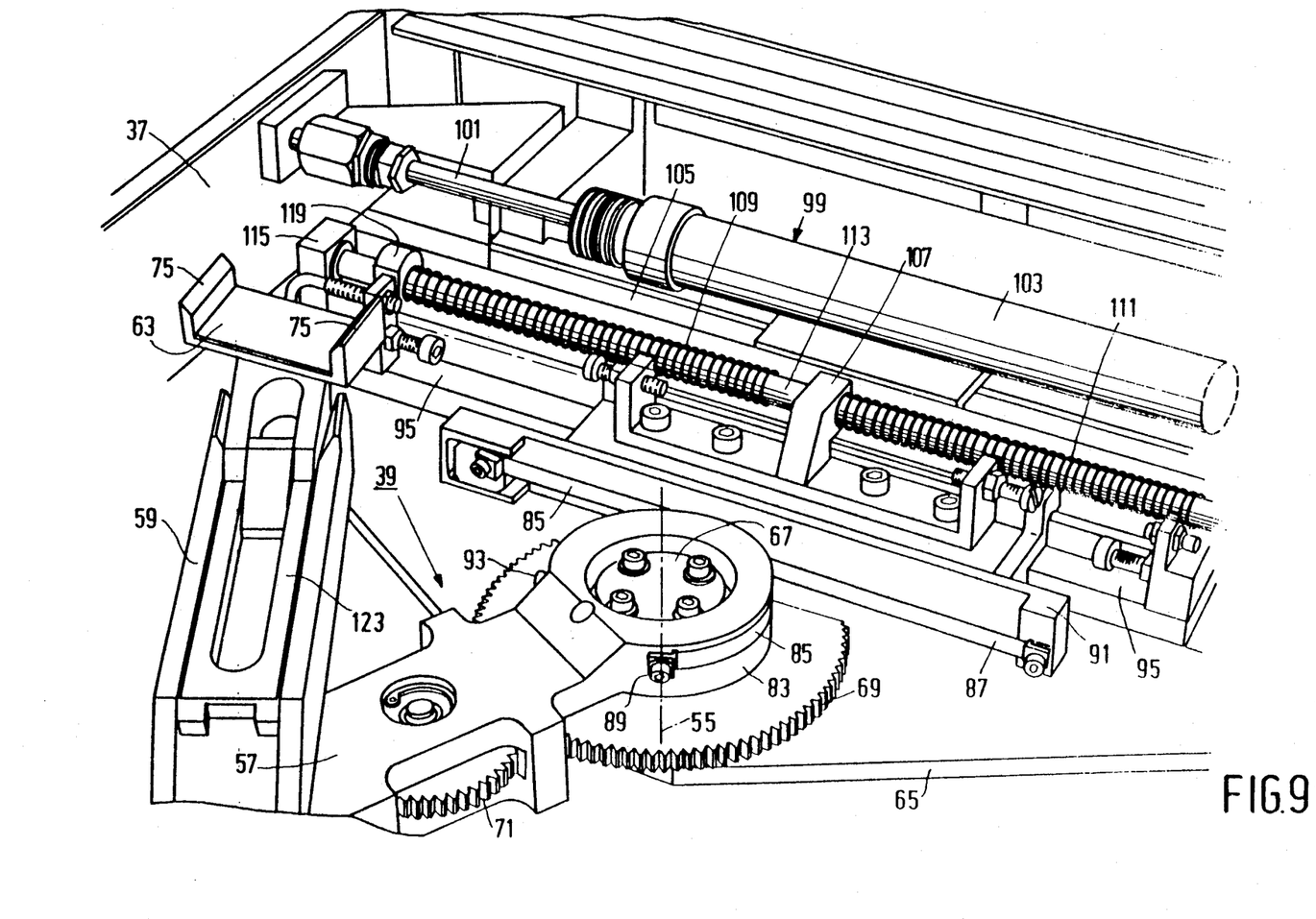
FIG. 9 shows on an enlarged scale a perspective view of a gripper mechanism shown in FIGS. 7 and 8.

The gripper mechanism 39 shown in FIGS. 7, 8 and 9 comprises a driving rod 57, which is rotatable about a main axis 55 and is pivotably connected to a supporting rod 59 at the area of a pivot axis 61 near its end remote from the main axis 55. The main axis 55 and the pivot axis 61 are parallel to each other. At its end remote from the pivot axis 61, the supporting rod 59 is provided with an end effector or gripper 63, which can be displaced along a straight horizontal line perpendicularly intersecting the main axis 55. It should be noted that from FIG. 7 to FIG. 9 the situation is shown in increasingly greater detail. Particulars about the drive of the rods 57 and 59, which comprise a transport means to be described later, are not visible in FIG. 7, but they are visible in FIGS. 8 and 9. The main axis 55 is constituted by the centre line of a stub shaft 67 (FIG. 9), which is connected to a slide 65 and on which the driving rod 57 is rotatably journalled (cf. FIG. 9). A gear wheel segment 69 secured to the slide 65 is integrated with the stub shaft 67. A gear wheel 71, which meshes with the gear wheel segment 69, and is rotatable about an axis parallel to the main axis 55, is journalled in the driving rod 57. A gear wheel 73, which meshes with the gear wheel 71 and is rotatable about the pivot axis 61, is secured to the supporting rod 59 (cf. FIG. 8). Upon rotation of the driving rod 57 about the main axis 55, the gear wheel 71 consequently rolls off over the gear wheel segment 69 and the gear wheel 73 rotates together with the supporting rod 59 about the pivot axis 61. The diameters of the so-called pitch circles of the gear wheel segment 69, of the gear wheel 71 and of the gear wheel 73 have a ratio of 2:1:1 and the lengths of the driving rod 57 and of the supporting rod 59 have a ratio of 1:1. The length of the driving rod 57 is to be understood to mean the shortest distance between the main axis 55 and the pivot axis 61, while the length of the supporting rod 59 is to be understood to mean the shortest distance between the pivot axis 61 and a line parallel thereto through the point of application of the gripper 63 with a carrier 11, 29. It should be noted that the gripper 63 has a U-shaped cross-section with limbs 75, which hook behind edges 77 (cf. FIGS. 11 and 12) of carriers 11,29. Due to the said diameter and length ratios, gripper 63 follows a straight line perpendicularly intersecting the main axis 55 and extending parallel to a pair of guides 79 on the frame 37. In the present case, in which two frames 37, which are arranged above each other, are secured to the slide 41 and each have a gripper mechanism 39, are concerned, the upper frame 37 has a first pair of parallel guides 79 and the lower frame 37 has a second pair of parallel guides 79. This therefore relates to the first embodiment of the selection device 33a. The selection device 33b comprises only one frame 37 secured to the slide 41 and having one pair of guides 79. As appears from FIGS. 7 and 8, the frame 37 is provided with two passages 81 for the gripper 63. The rotation of the driving rod 57 is obtained as follows (cf. FIG. 9). The end of the driving rod 57 located near the main axis 55 is in the form of a circular disk 83, onto which a first flexible metal strip 85 and a second flexible metal strip 87 can be wound. The first strip 85 is secured by one end to the disk 83 at a point designated by reference numeral 89 and by its other end to a carriage 91 displaceable over the slide 65 (FIG. 8). The second strip 87 is secured by one end to the disk 83 at a point designated by reference numeral 93 (FIG. 9) and by its other end to the carriage 91. The carriage 91 is displaceable along a straight line guide 95, which is secured on the slide 65 and is parallel to the line along which the gripper 63 is displaced. A known first pneumatic motor 97 (cf. FIG. 7), which has a follower element not shown in the drawing, is secured on the slide 65. This follower element is coupled with the carriage 91. The slide 65 is coupled with a known second pneumatic motor 99, of which a piston rod 101 is secured to the frame 37 and of which a cylinder 103 is secured to the slide 65. The slide 65 is also displaceable along a guide 105 (cf. FIGS. 8 and 9) parallel to the straight line which is followed by the gripper 63. The carriage 91 is provided with a flange 107, which serves as a support and which is engaged on one side by a helical spring 109 and on the other side by a helical spring 111. The helical springs 109 and 111 are arranged to surround a circular rod 113, which is passed through the flange 107 and is supported in two bearing blocks 115 and 117, which are secured on the slide 65

(cf. FIG. 8). Supports 119 and 121 for the springs 109 and 111 are secured on the rod 113. In the situation shown in FIGS. 8 and 9, only the spring 111 is under stress; the spring 109 is not loaded. The springs 109 and 111 are consequently subjected to compressive stress or they are not loaded and are therefore used as compression springs. By means of the springs 109 and 111, no inadmissible collision forces are exerted on the carrier and carriage 91 at the end of the stroke. Such collision forces would be caused by the first pneumatic motor 978 (cf. FIG. 7), which supplies a substantially constant driving force over the whole trajectory over which the carriage 91 is displaced. As appears from FIGS. 8 and 9, a lift rod 123 is provided in the supporting rod 59. The gripper 63 is secured on the lift rod 123 so as to be rotatable about an axis parallel to the main axis 55. The lift rod 123 is rotatable (not shown) in the supporting rod 59 and is for this purpose driven pneumatically in known manner by a tiltable piston rod, which is secured to the supporting rod 59, and a tiltable cylinder, which is secured to the lift rod. The operation of the gripper mechanism will now be described more fully also with reference to the diagrammatic FIG. 10.

Figure 10:
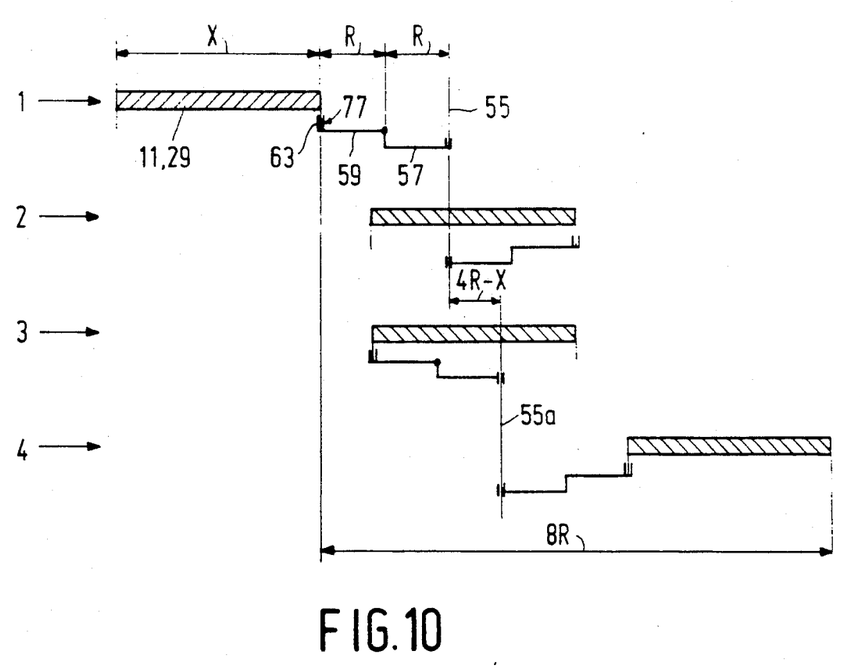
FIG. 10 shows diagrammatically the operation of the gripper mechanism shown in FIGS. 7 to 9.

In FIG. 10.1, the gripper 63 is situated in the position indicated in illustrations 5.5 and 6.13, in which a carrier 11,29 is removed from the container 31,27. The lefthand limb 75 (FIG. 9) of the gripper 63 is then hooked in the upper position of the lift rod 123 behind the righthand edge 77 of the carrier 11,29. Since the length of the driving rod 57 and the supporting rod 59 with lift rod 123 are both equal to R, the lefthand limb 75 of the gripper 63 is located at a distance 2R plus half the gripper width from the main axis 55. The width of the gripper is neglected hereinafter for the sake of simplicity. It is further assumed that the carrier 11,29 has a width X satisfying the situation X>2R. In the situation illustrated in FIG. 10.1, the slide 65 (FIG. 7) is located in the extreme lefthand position within the frame 37 (FIG. 7). This position corresponds to the situation shown in illustrations 5.5 and 6.13, in which the selection device 33a and 33b, respectively, is ready to remove a full carrier 11,29 from the container 31,27, and to the situation shown in FIGS. 1, 2, 11 and 12, in which a carrier 11,29 present in the positioning device must be fetched (just after decentering). By a rotation of the driving rod 57 about the main axis 55 through an angle of $+\pi$ radians, in which event the gripper 63 following a straight line pulls the carrier 11,29 into the guides 79 of the frame 37 of L-shaped cross-section, the gripper mechanism is in the position indicated in FIG. 10.2. The carriage 11,29 is now displaced to the right by means of rollers 125 (FIG. 11) in the guides 79 over a distance 4R. The position of the gripper mechanism indicated in FIG. 8 was then passed. The gripper 63 is now detached from the righthand edge 77 of the carrier 11,29 by lowering the lift rod 123 in the supporting rod 59. Subsequently, the slide 65 is displaced to the right by means of the second pneumatic motor 99 over a distance $4R-X$ so that the main axis 55 occupies the position indicated by reference numeral 55a (FIG. 10). Subsequently, the driving rod 57 is rotated through an angle of $-\pi$ radians about the main axis 55 and the lift rod 123 with the gripper 63 is raised again. In this manner, the lefthand edge 77 of the carrier 11,29 is gripped as indicated in FIG. 10.3. Finally, the driving rod 57 is again rotated through an angle of $+\pi$ radians about the main axis 55. The overall horizontal displacement of the carrier 11,29 is now 8R and suffices for a transport from the container 27,31 through the selection devices 33a, 33b to the positioning device, or conversely. The distance 8R is covered in stages and generally not at the same vertical level. After a distance 4R has been covered, the carrier is situated in the selection device, which then chooses the desired level by raising or lowering the frame 37. It is not until then that a next distance 4R is covered in horizontal direction.

Figure 13:
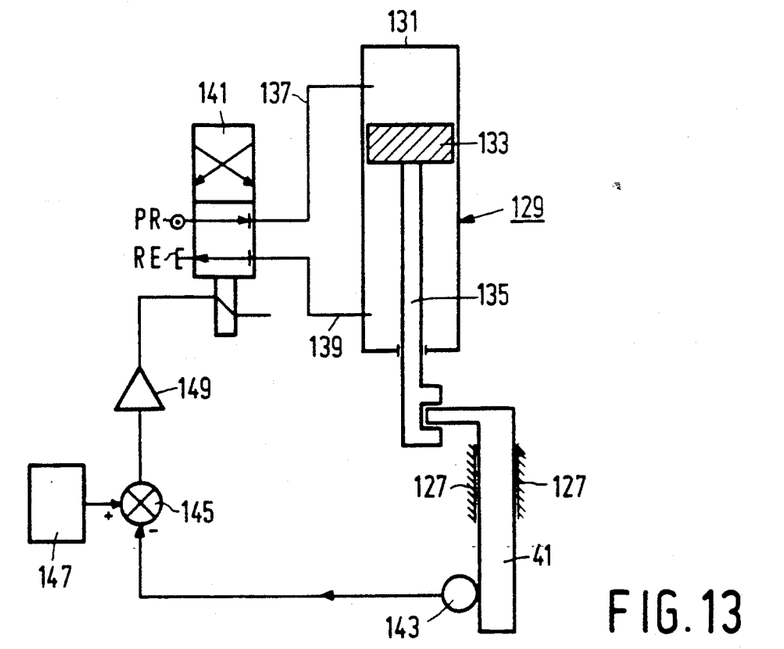
FIG. 13 shows diagrammatically a vertical drive of the selection device.

The steps of raising and lowering the frame 37 in the selection devices 33a, 33b are described with reference to FIGS. 11 and 12 and the diagrammatic drive shown in FIG. 13. The FIGS. 11 and 12 relate to a selection device 33a having two frames 37 and two gripper mechanisms 39. Essentially, the drive of a selection device 33b having only one gripper mechanism 39 in one frame 37 is equal to the drive of the selection device 33a.

The selection device 33a is provided with a number of parallel guides 127, which extend in vertical direction and in which the slide 41 is guided. The slide 41 is displaced by means of a third pneumatic motor 129 (cf. FIG. 13), of which a piston 133 displaceable in a cylinder 131 is coupled by means of a piston rod 135 with the slide. Above and below the piston 133, the cylinder 131 is connected by means of leads 137 and 139, respectively, to an electro-pneumatic 4/2 valve 141 having a pressure port PR and an exhaust port RE. The displacement of the slide is measured by means of a mechano-electrical converter 143, of which the output signal is supplied to a comparator 145. From a programming unit 147, which comprises a so-called set point generator, a signal corresponding to the desired position of the slide 41 is supplied to the comparator 145 and is compared therein with the output signal of the converter 143. The comparator generates a difference signal, which after amplification is an amplifier 149 is used for energization of the coil of the electro-pneumatic valve 141. Thus, the slide 41 can be brought into any desired vertical position and held in this position. The slide 41 may be provided with a lock which is activated when the desired position is reached. When the slide 41 is held mechanically by a lock in the guides 127 in the desired position, a stable positioning is attained without a continuous pneumatic control being necessary. Such a lock may be controlled pneumatically, electro-pneumatically or electro-magnetically and is of a conventional type.

As appears from the foregoing, with a device according to the invention an assembly and/or a production system is obtained which is very flexible in such a way that an optimum freedom of choice is present with regard to the kind of components and products as well as with regard to the order in which the various operations can be carried out. This is also due to the fact that the system has a strongly modular construction. It should be noted that the pneumatic drives or motors described may be replaced by electrical or hydraulic drives.

The selection device may be used essentially at an unlimited number of vertical and horizontal levels and may be combined with many kinds of transport tracks, although the combination with the variable transport system described has particular advantages with regard to flexibility, production modifications, system enlargement, etc.

What is claimed is:

1. A device for the transport of carriers from and to a positioning device, including containers for said carriers which are grouped in a vertical direction in said containers, said containers being displaceable in a horizontal direction, a selection device capable of being coupled to said containers, a gripper mechanism being provided with said selection device said gripper mechanism being displaceable in the horizontal direction and capable of being coupled with carriers for displacement of such carriers in the horizontal direction, said gripper mechanism including transport means which functions to transport a predetermined carrier through a horizontal distance equal to a multiple of the length of said transport means by being coupled to one end of said predetermined carrier and undergoing a first rotation which moves said predetermined carrier substantially twice the length of said transport means, said transport means undergoing a second rotation which cancels said first rotation and being coupled to the other end of said predetermined carrier and undergoing a third rotation which moves said predetermined carrier substantially an additional two lengths of said transport means.

2. A device as claimed in claim 1, wherein said transport means functions to move said predetermined carrier substantially four lengths of said transport means by undergoing a predetermined horizontal displacement with respect to said carrier equal to twice the length of said transport means minus the length of said carrier between said first and third rotations.

3. A device as claimed in claim 2 wherein said predetermined horizontal displacement takes place between either said first and second rotation or between said second and third rotation.

4. A device as claimed in claim 1, 2, or 3, wherein the gripper mechanism comprises two rods, which are displaceable in a horizontal plane at right angles to a vertical main axis and of which a driving rod is rotatable about the main axis, while a supporting rod pivotably connected to the driving rod is rotatable about a pivot axis parallel to the main axis, an end effector coupled near the end of the supporting rod remote from the driving rod with the supporting rod being displaceable along a straight line, which perpendicularly intersects the main axis.

5. A device as claimed in claim 4, wherein the driving rod is rotatably journalled at the area of the main axis in a slide which is displaceable parallel to the said straight line along which the end effector is displaceable, this slide being provided with a drive for the rotation about the main axis of the driving rod.

6. A device as claimed in claim 5, wherein the drive of the driving rod supported by the slide has a first gear wheel, which is secured on the slide, whose centre line coincides with the main axis and which meshes with a second gear wheel, which is rotatably arranged on the driving rod which rolls off over the first gear wheel and meshes with a third gear wheel, which is secured on the supporting rod and whose centre line coincides with said pivot axis, the pitch circle diameters of the first, second and third gear wheels having a ratio of 2:1:1, while the length of the driving rod and the supporting rod have a ratio of 1:1.

7. A device as claimed in claim 5, wherein the slide constitutes a guide for a carriage, which is displaceable with respect thereto parallel to said straight line and is coupled by means of two flexible strips with a disk, which is secured to the driving rod and is rotatable together with the driving rod about the main axis.

8. A device as claimed in claim 7, wherein the carriage is coupled with a first pneumatic motor secured on the slide, while the carriage is displaceable against the spring force with respect to the slide.

9. A device as claimed in claim 8, wherein the slide is coupled with a second pneumatic motor.

10. A device as claimed in claim 9, wherein the selection device is displaceable in a vertical direction along the magazine and is coupled with a third pneumatic motor.

11. A device as claimed in claim 10, wherein the selection device comprises a first and second gripper mechanism arranged in a frame.

12. A device as claimed in claim 10, wherein the selection device comprises a single gripper mechanism by means of which carriers are displaceable.

13. A device as claimed in claim 6, wherein the slide constitutes a guide for a carriage, which is displaceable with respect thereto parallel to the said line and is coupled by means of two flexible strips with a disk, which is secured to the driving rod and is rotatable together with the driving rod about the main axis.

* * * * *